United States Patent
Hausammann

(10) Patent No.: US 11,996,490 B2
(45) Date of Patent: May 28, 2024

(54) SOLAR ARRAY

(71) Applicant: Paul Hausammann, Boston, MA (US)

(72) Inventor: Paul Hausammann, Boston, MA (US)

(*) Notice: Subject to any disclaimer, the term of this patent is extended or adjusted under 35 U.S.C. 154(b) by 0 days.

(21) Appl. No.: 17/815,956

(22) Filed: Jul. 29, 2022

(65) Prior Publication Data

US 2022/0384669 A1  Dec. 1, 2022

Related U.S. Application Data

(62) Division of application No. 16/550,630, filed on Aug. 26, 2019, now Pat. No. 11,462,653.

(60) Provisional application No. 62/722,199, filed on Aug. 24, 2018.

(51) Int. Cl.
*H01L 31/054* (2014.01)
*H01L 31/047* (2014.01)
*H02S 40/22* (2014.01)

(52) U.S. Cl.
CPC ...... *H01L 31/0543* (2014.12); *H01L 31/0547* (2014.12); *H02S 40/22* (2014.12); *H01L 31/047* (2014.12)

(58) Field of Classification Search
CPC .. H01L 31/0543; H01L 31/0547; H02S 40/22
See application file for complete search history.

(56) References Cited

U.S. PATENT DOCUMENTS

| | | |
|---|---|---|
| 5,538,563 A | 7/1996 | Finkl |
| 5,977,478 A | 11/1999 | Hibino et al. |
| 6,057,505 A * | 5/2000 | Ortabasi ............. H01L 31/0687 136/246 |
| 2009/0101193 A1 | 7/2009 | Hsiao |
| 2009/0255568 A1 | 10/2009 | Morgan |
| 2010/0133422 A1 | 6/2010 | Lin et al. |
| 2011/0162712 A1 | 7/2011 | Tillin et al. |
| 2012/0006405 A1 | 1/2012 | Sutin |

FOREIGN PATENT DOCUMENTS

KR  20140077244 A  6/2014

OTHER PUBLICATIONS

PCT International Application No. PCT/US2019/048090, International Search Report, dated Nov. 9, 2019, 6 pages.
PCT International Application No. PCT/US2019/048090, Written Opinion of The International Searching Authority, dated Nov. 9, 2019, 2 pages.

* cited by examiner

*Primary Examiner* — Lindsey A Buck
(74) *Attorney, Agent, or Firm* — DLA Piper LLP US

(57) ABSTRACT

One or more solar cells arranged on a mounting surface along a first direction and extending out from the mounting surface in a second direction that is substantially perpendicular to the first direction. One or more angled reflectors may be arranged on the mounting surface along the first direction. The one or more angled reflectors may include a lens in a wedge shape having: an entrance surface extending along the first direction including one or more curved surfaces a bottom surface extending along the second direction and adjacent to the corresponding solar cell of the one or more solar cells, and a reflector surface extending along the second direction at an angle. The reflector surface may include a gradient texture comprising one or more flat surfaces, each of which is substantially parallel to the first direction, and one or more angled elevation surfaces.

8 Claims, 11 Drawing Sheets

© SOLAR ARRAY

CROSS REFERENCE TO RELATED APPLICATIONS

The present application is a divisional of U.S. application Ser. No. 16/550,630, filed on Aug. 26, 2019, which claims priority to U.S. Prov. App. No. 62/722,199, filed on Aug. 24, 2018, the contents of each are incorporated by reference herein.

FIELD

The present disclosure relates to an improved solar light collection array and methods of manufacturing and using such a system.

BACKGROUND

As the world population grows, and non-renewable energy sources are depleted, renewable energy sources must become more prevalent, efficient, and cost-effective to meet energy demands.

Solar energy is renewable and environmentally friendly. Terrestrial solar cells with photovoltaic (PV) elements convert radiant energy from sunlight into electrical energy. Solar cells are usually made using silicon wafers that absorb sunlight in a way that creates free electrons to create direct current (DC) power. The DC power generated by an array including several solar cells is collected on a grid placed on the cells.

Solar-electricity generation is currently performed in both residential and commercial settings. In a typical residential application, an array of solar cells is mounted on a house's rooftop, and the generated electricity is typically supplied only to that house. The benefit of mounting solar arrays on residential houses is that the localized generation of power reduces losses associated with transmission over long power lines. However, current solar-electricity generation devices are typically not economically feasible in residential settings.

Solar arrays on residential houses usually includes flat panel solar arrays which are solar cells arranged on large, flat panels and subjected to unfocused direct and diffuse sunlight, whereby the amount of sunlight converted to electricity is directly proportional to the area of the solar cells. An advantage of flat panel solar arrays is that their weight-to-size ratio is relatively low, facilitating their use in residential applications because they can be mounted on the rooftops of most houses without significant modification to the roof support structure. However, flat panel solar arrays have relatively low efficiencies which requires large areas to be covered in order to provide sufficient amounts of electricity to make their use worthwhile. Thus, due to the high cost of silicon, it can take 20 to 25 years for a home owner to recoup the investment by the savings on his/her electricity bill. Economically, flat panel solar arrays are not a viable investment for a typical homeowner without subsidies.

The improved solar array of the present disclosure reduces the amount of area needed to convert sunlight to provide sufficient amounts of electricity. This improved solar array may be mounted on residential rooftops over a smaller area to produce more electricity, allowing a higher generation of electricity by home owners. Allowing home owners to recoup the investment much faster on their electric bills.

This can accelerate recoupment of costs, without government subsidies, and can permit the improved solar array to be adopted worldwide.

SUMMARY

Disclosed herein is a solar array, which can include one or more solar cells arranged on a mounting surface along a first direction and extending out from the mounting surface in a second direction that is substantially perpendicular to the first direction. One or more angled reflectors may be arranged on the mounting surface along the first direction. The one or more angled reflectors may include a lens in a wedge shape having: an entrance surface extending along the first direction including one or more curved surfaces a bottom surface extending along the second direction and adjacent to the corresponding solar cell of the one or more solar cells, and a reflector surface extending along the second direction at an angle. The reflector surface may include a gradient texture comprising one or more flat surfaces, each of which is substantially parallel to the first direction, and one or more angled elevation surfaces.

In some embodiments, the reflector surface can adopt a gradient texture, which can include a plurality of flat surfaces and a plurality of elevation surfaces. An angle $\beta$ can be formed between each of the flat surfaces and each of the elevation surfaces, the angle $\beta$ can be about 30 to 60 degrees. In some embodiments, the angle $\beta$ can be about 45 degrees.

Also disclosed herein is a method of increasing electricity output in a solar array in a given area, the method can include directing a source light into one or more solar cells arranged on a mounting surface along a first direction and extending out from the mounting surface in a second direction that is substantially perpendicular to the first direction. One or more angled reflectors may be arranged on the mounting surface along the first direction. The one or more angled reflectors may include a lens in a wedge shape having: an entrance surface extending along the first direction including one or more curved surfaces a bottom surface extending along the second direction and adjacent to the corresponding solar cell of the one or more solar cells, and a reflector surface extending along the second direction at an angle. The reflector surface may include a gradient texture comprising one or more flat surfaces, each of which is substantially parallel to the first direction, and one or more angled elevation surfaces. The one or more solar cells may generate electricity from the source light.

BRIEF DESCRIPTION OF DRAWINGS

In order to facilitate a full understanding of the present disclosure, reference is now made to the accompanying drawings, in which like elements are referenced with like numerals. These drawings should not be construed as limiting the present disclosure but are intended to be illustrative only. The drawings are not necessarily to scale, or inclusive of all elements of a system, emphasis instead generally being placed upon illustrating the concepts, structures, and techniques sought to be protected herein.

DESCRIPTION

Figure 1A:
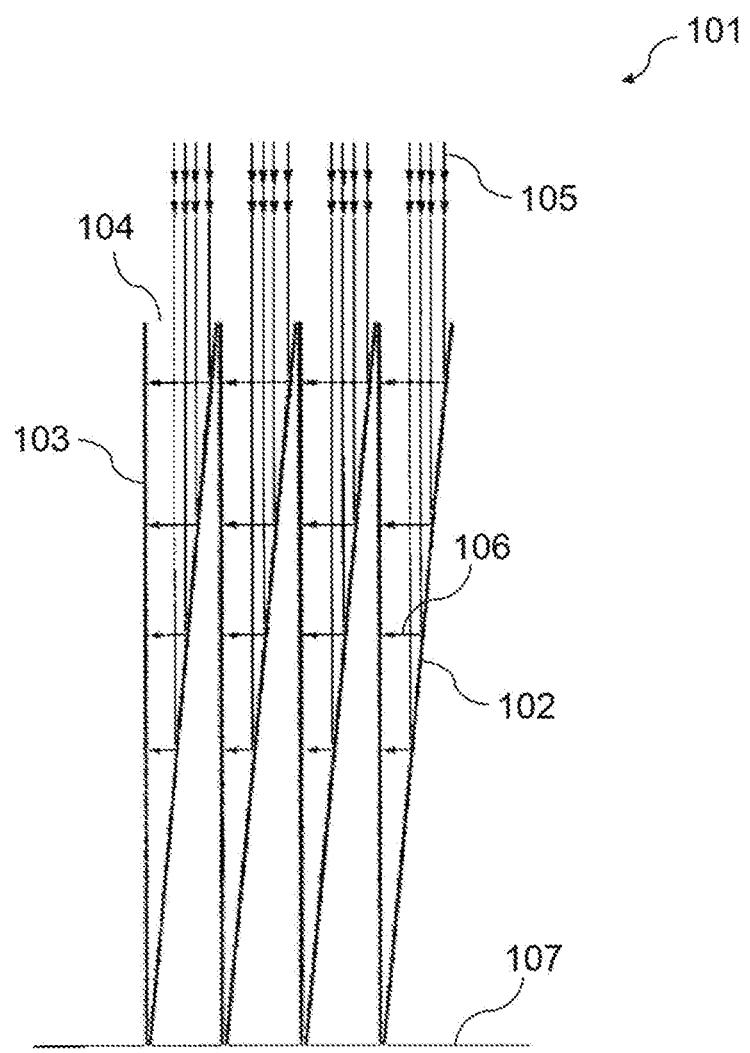
FIG. 1A is a side cross-sectional view of a solar array, according to some embodiments of the present disclosure.

There are additional features of the disclosure that will be described hereinafter, which will form the subject matter of the claims appended hereto. In this respect, before explaining at least one embodiment of the disclosure in detail, it is to be understood that the disclosure is not limited in its application to the details of construction and to the arrangements of the components set forth in the following description or illustrated in the drawings. The disclosure is capable of other embodiments and of being practiced and carried out in various ways. Also, it is to be understood that the phraseology and terminology employed herein are for the purpose of the description and should not be regarded as limiting.

In embodiments of the subject disclosure, the term "substantially" is defined as at least close to (and can include) a given value or state, as understood by a person of ordinary skill in the art. In one embodiment, the term "substantially" refers to ranges within 10%, preferably within 5%, more preferably within 1%, and most preferably within 0.1% of the given value or state being specified.

There are additional features of the disclosure that will be described hereinafter, and which will form the subject matter of the claims appended hereto. These together with other objects of the disclosure, along with the various features of novelty, which characterize the disclosure, are pointed out with particularity in the claims annexed to and forming a part of this disclosure.

While several variations of the present disclosure have been illustrated by way of example in particular embodiments, it is apparent that further embodiments could be developed within the spirit and scope of the present disclosure. However, it is to be expressly understood that such modifications and adaptations are within the spirit and scope of the present disclosure, and are inclusive, but not limited to the following appended claims as set forth.

This disclosure relates to an improved solar light collection array that can produce more electricity per unit in a reduced area over conventional solar arrays.

FIG. 1A shows a solar array 101, according to some embodiments of the present disclosure. Solar array 101 can include a plurality of reflectors 102 and a plurality of solar cells 103 on a mounting surface 107. In some embodiments, the plurality of reflectors 102 can be mirrors, and there can be empty space between each the plurality of reflectors 102 and each of the plurality of solar cells 103. In some embodiments, reflector 102 can be a surface in a lens (not shown in FIG. 1), which can be placed between each the plurality of reflectors 102 and each of the plurality of solar cells 103. The lens can be transparent and wedge-shaped. A source light 105 can enter solar array 101 through an entrance surface 104, which can be reflected by reflector 102. A reflected light 106 can be collected by the plurality of photovoltaic solar cells 103.

Figure 1B:
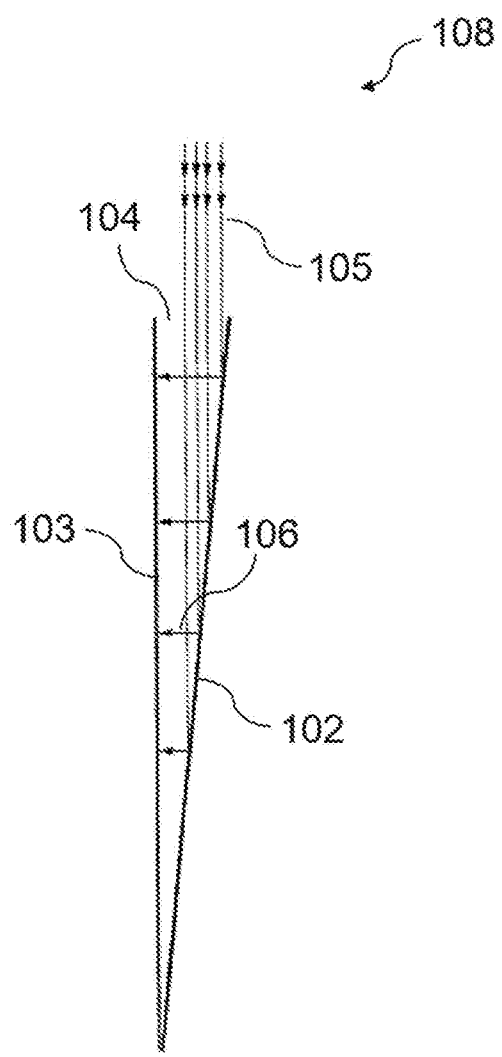
FIG. 1B is a side cross-sectional view of one unit in a solar array, according to some embodiments of the present disclosure.

FIG. 1B shows a solar unit 108 including a single reflector 102 and a single solar cell 103. Similarly, as solar array 101 illustrated in FIG. 1A, a source light 105 can enter the solar unit 108 through an entrance surface 104 and reflected by a reflector 102. A reflected light 106 can be collected by the plurality of photovoltaic solar cells 103.

Figure 2A:
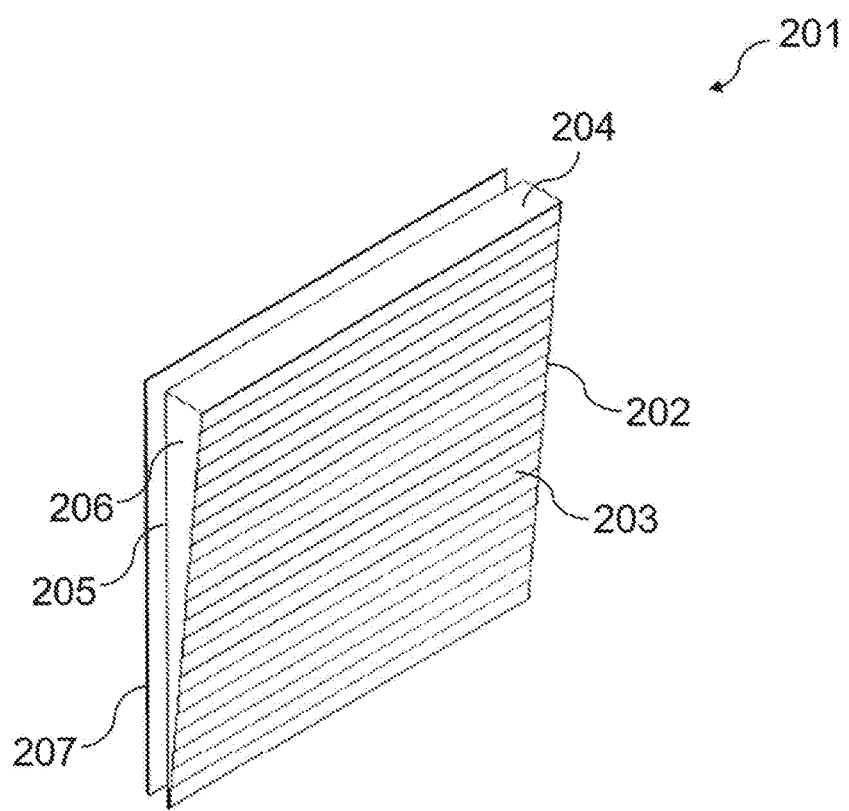
FIG. 2A is a perspective view of a solar unit in a solar array, according to some embodiments of the present disclosure.
Figure 2B:
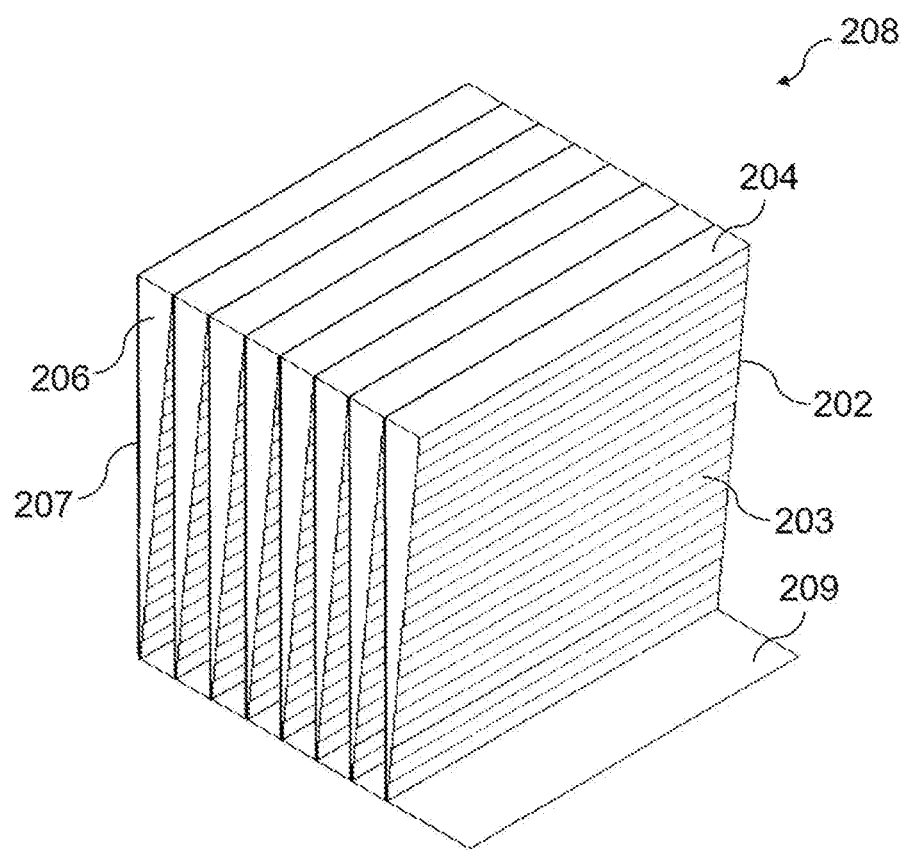
FIG. 2B is a perspective view of a solar array, according to some embodiments of the present disclosure.

FIG. 2A is a perspective view of a solar unit 201 in a solar array, according to some embodiments of the present disclosure. FIG. 2B is a perspective view of a solar array 208 on a mounting surface 209, according to some embodiments of the present disclosure. In this embodiment shown by FIGS. 2A and 2B, a lens 202 with a reflector surface 203 can adopt a gradient texture. Lens 202 can include reflector surface 203, an entrance surface 204, a bottom surface 205, and a side cross-section 206. A solar cell 207 can be disposed against bottom surface 205 to receive the reflected light from reflector surface 203 which travels through lens 202.

Figure 3:
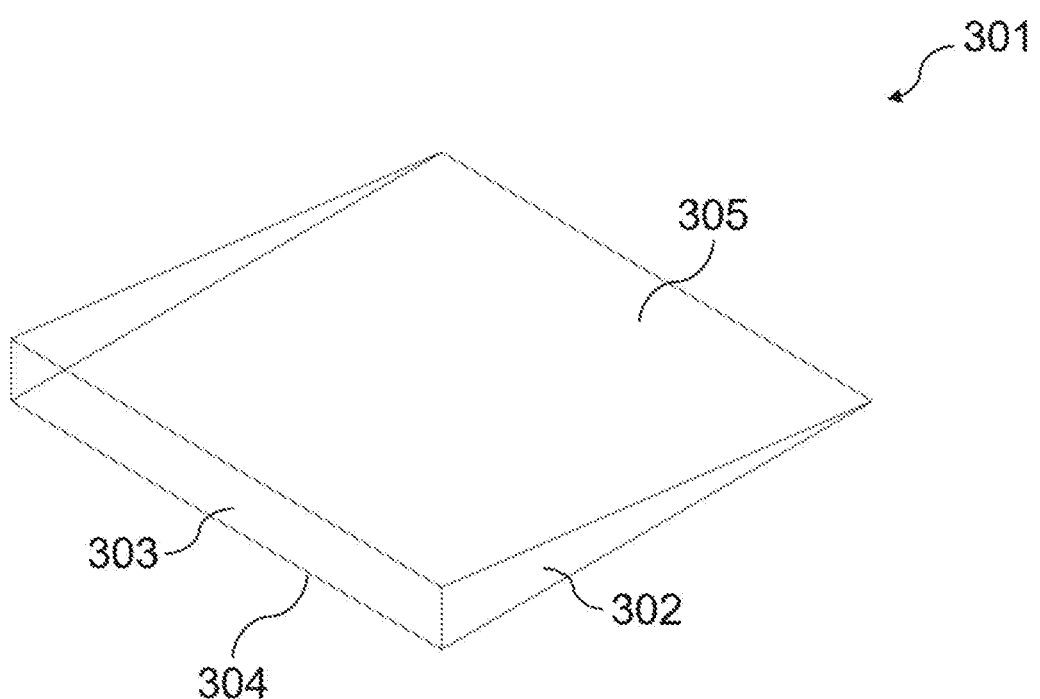
FIG. 3 is a top perspective view of a lens, according to some embodiments of the present disclosure.

In some embodiments, a lens 301 is used, FIG. 3 shows a top perspective view of lens 301 in a transparent wedged shape, according to some embodiments of the present disclosure. Each lens 301 can include a side cross-section 302, an entrance surface 303, a bottom surface 304, and a reflector surface 305. Each of side cross-section 302, entrance surface 303, bottom surface 304, and reflector surface 305 can be substantially flat.

During operation in the embodiments where lens 301 is used, a source light can enter each lens 301 through the aligned entrance surfaces 303. The source light can travel through lens 301 onto reflector surface 305, which can be constructed to serve as a reflector. Reflector surface 305 can reflect the source light and convert it to reflected light onto photovoltaic solar cells disposed against bottom surface 304 of lens 301. The solar cells can convert reflected light to direct current electricity for storage on the solar array grid.

The lenses can be made of unitary pieces of transparent material, including, but not limited to glass, plastic, and sapphire. The length of reflector surface can be determined by the Pythagorean theorem such that it is the square root of the sum of the square of the length of entrance surface and the square of the length of bottom surface $\sqrt{(a^2+b^2)}$.

The plurality of lenses can be placed in solar array such that the bottom surfaces can be all substantially parallel with each other, and substantially parallel with the direction of the source light. Entrance surfaces can be all substantially aligned substantially perpendicular with the direction of source light.

Photovoltaic solar cell can be placed in a substantial alignment with bottom surface of each lens. In some embodiments, the reflector can be a mirror.

Figure 4:
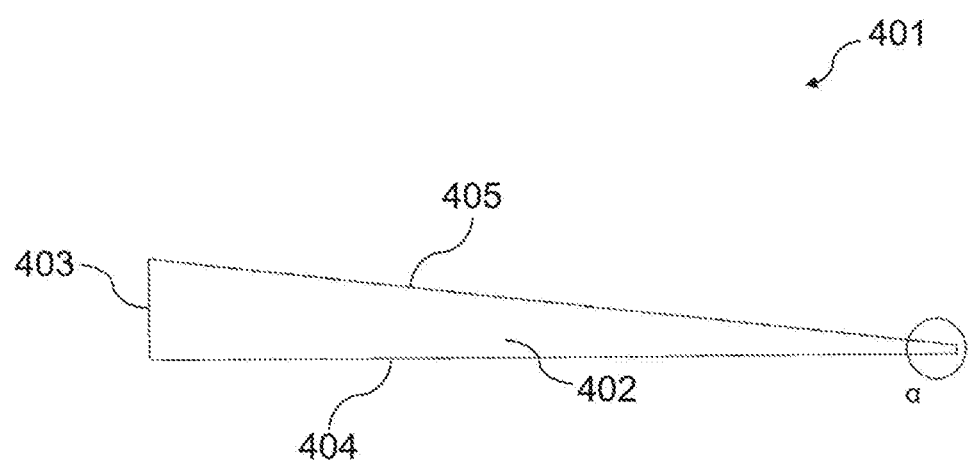
FIG. 4 is a side view of a lens, according to some embodiments of the present disclosure.

FIG. 4 is a side view of lens 401 in a wedge shape, according to some embodiments of the present disclosure. Lens 401 can include side cross-section 402, entrance surface 403, bottom surface 404, and reflector surface 405. Side cross-section 402, entrance surface 403, bottom surface 404, and reflector surface 405 can be substantially flat. The angle formed between entrance surface 403 and bottom surface 404 can be about 90 degrees. The angle α formed between bottom surface 404 and reflector surface 405 can be about 0 to 45 degrees, about 5 to 30 degrees, about 10 to 15 degrees, about 0 to 15 degrees, or about 10 to 45 degrees. In some embodiments, the angle α between bottom surface 404 and reflector surface 405 can be about 7.5 degrees. In some embodiments, the angle α can is determined by the length of entrance surface 403 and the length of bottom surface 404 and is relative to the number of cells used in the array. In some embodiments, the reflector surface of the lens 405 can be substantially flat. In some embodiments, the reflector surface of the lens 405 can adopt a step like gradient texture with multiple angled facets arranged in a way to cause the source light to be reflected such that it strikes the surface of the solar cell at a substantially perpendicular angle, as shown in FIG. 5.

Figure 5:
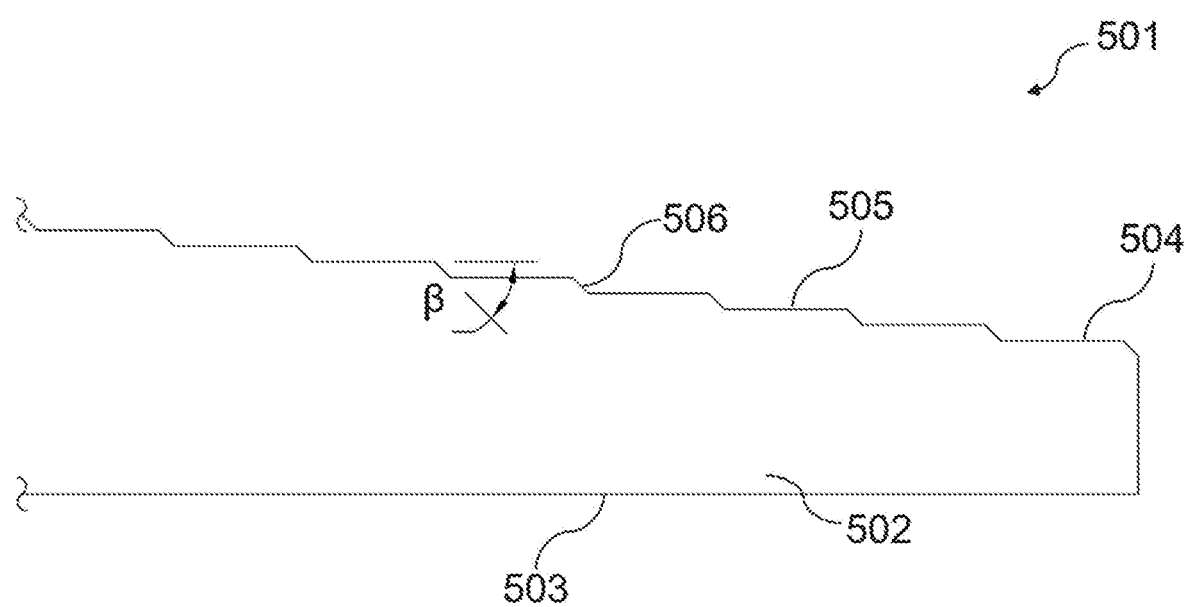
FIG. 5 is a partial enlarged side view of a lens, according to some embodiments of the present disclosure.

FIG. 5 is a partial enlarged side view of a lens 501, according to some embodiments of the present disclosure. Lens 501 can include side cross-section 502, bottom surface 503, and reflector surface 504. In the embodiments shown by FIG. 5, side cross-section 502 and bottom surface 503 can be substantially flat. Reflector surface 504 can be provided as a gradient surface, such that reflector surface 504 can serve as a reflector to reflect source light and convert it to a reflected light to be received by solar cells. The gradient texture of reflector surface 504 can include a flat surface 505 that is substantially parallel to bottom surface 503, and an elevation surface 506, with an angle β. The angle β can be about 5 to 90 degrees, about 10 to 80 degrees, about 20 to 70 degrees, about 30 to 60 degrees, about 40 to 50 degrees, about 40 to 90 degrees, or about 5 to 50 degrees. In some embodiments, the angle β can be about 45 degrees. The gradient texture of reflector surface 504 shown in FIG. 5 is a non-limiting example, other textures are contemplated for reflector surface 504 such that it can efficiently reflect light towards the solar cell.

FIGS. 6A-6D illustrate examples of different embodiments of the lens in wedge shape, according to the present disclosure. In the embodiment of a lens 601 shown in FIG. 6A, lens 601 can include an entrance surface 605, a reflector surface 606, a side cross-section 607, and a bottom surface (not shown). Entrance surface 605, reflector surface 606, and side cross-section 607, in this embodiment can be substantially flat.

Figure 6A:
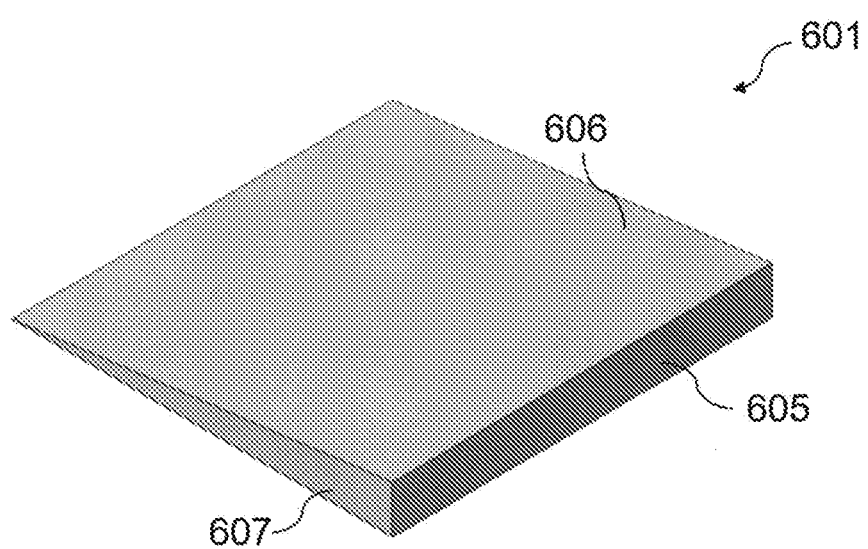
FIG. 6A is a top perspective view of a lens, according to some embodiments of the present disclosure.
Figure 6B:
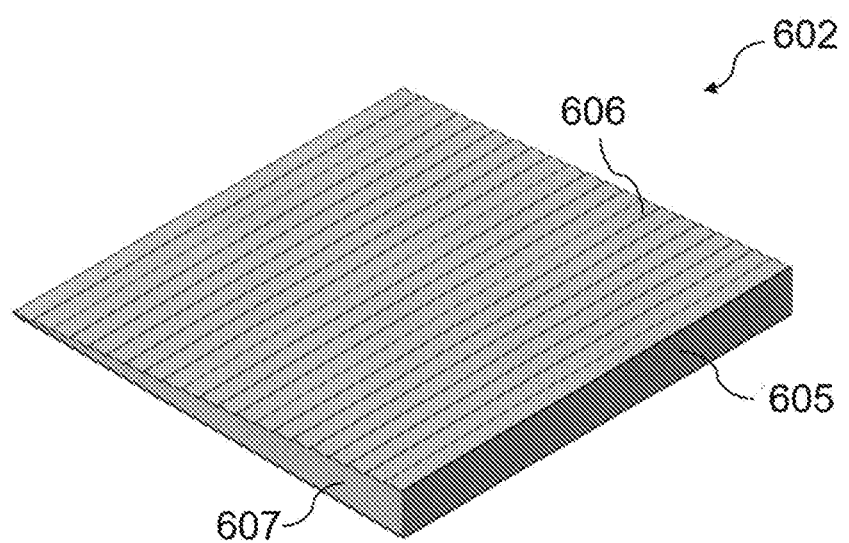
FIG. 6B is a top perspective view of a lens, according to some embodiments of the present disclosure.

In the embodiment of a lens 602 shown in FIG. 6B, lens 602 can include an entrance surface 605, a reflector surface 606, a side cross-section 607, and a bottom surface (not shown). Entrance surface 605 and side cross-section 607 can be substantially flat. Reflector surface 606 in this embodiment can be gradient textured to serve as a reflector.

Figure 6C:
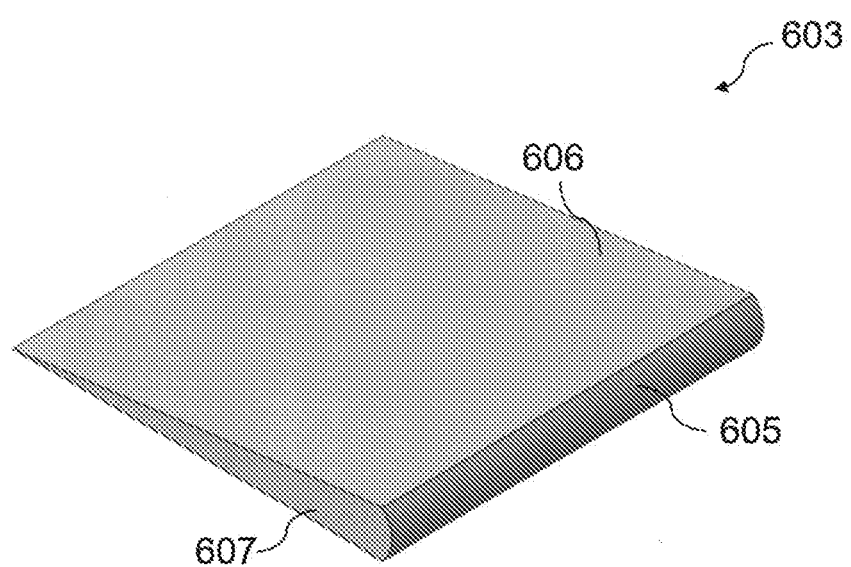
FIG. 6C is a top perspective view of a lens, according to some embodiments of the present disclosure.

In the embodiment of a lens 603 shown in FIG. 6C, lens 603 can include an entrance surface 605, a reflector surface 606, a side cross-section 607, and a bottom surface (not shown). Side cross-section 607 and reflector surface can be substantially flat. Entrance surface 605 in this embodiment can adopt a curved shape, which can increase the efficiency of capturing more source light.

Figure 6D:
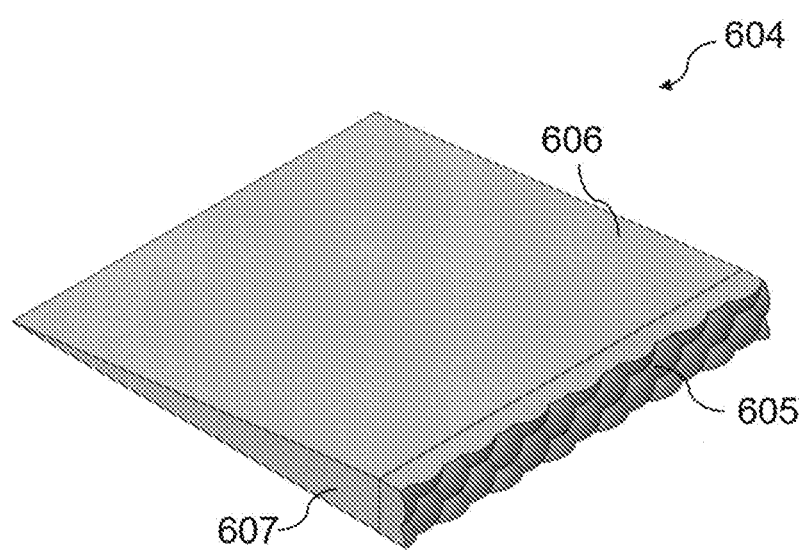
FIG. 6D is a top perspective view of a lens, according to some embodiments of the present disclosure.

In the embodiment of a lens 604 shown in FIG. 6D, lens 604 can include an entrance surface 605, a reflector surface 606, a side cross-section 607, and a bottom surface (not shown). Side cross-section 607 and reflector surface can be substantially flat. Entrance surface 605 in this embodiment can include a plurality of substantially rounded shapes, which can increase the efficiency of capturing more source light.

The following examples are provided to further illustrate the advantages and features of the present disclosure, but they are not intended to limit the scope of the disclosure. While the examples are typical of those that might be used, other procedures, methodologies, or techniques known to those skilled in the art may alternatively be used.

EXAMPLES

Example I

In a conventional setup, a single solar cell 2.05 in ×2.05 in (5.207 cm×5.207 cm) is placed flat on the surface, and source light encounters the solar cell from a perpendicular direction. The surface area of the solar cell is about 4.20 in$^2$ (27.09 cm$^2$), by comparison, in the solar array setup according to the present disclosure, seven 2.05 in ×2.05 in (5.207 cm×5.207 cm) solar cells are used with seven lenses each having an entrance surface measurement of about 0.25 in ×2.0 in (0.635 cm×5.08 cm). The bottom surface is about 2.0 in ×2.0 in (5.08 cm×5.08 cm). Each lens having gradient reflective surface comprised of one hundred 0.0033 in ×2.0 in (0.0084 cm×5.08 cm) angled surfaces arranged to be substantially at 45° relative to both the source light and the surface of the solar cell. The top surface of the array assembly is about 2.02 in ×2.0 in (5.13 cm×5.08 cm) having a total surface area of about 4.04 in$^2$ (26.06 cm$^2$). The comparative electrical measurements of a single conventional cell and the solar array are listed in Table 1.

TABLE 1

Comparison of the energy output based on conventional setup and the present disclosure.

| | Voltage (VDC) | Current (mA) | Watts (W) |
|---|---|---|---|
| Conventional single cell (surface area 4.20 in$^2$) | 0.568 | 89.9 | 0.051 |
| Series Array based on the present disclosure (surface area 4.04 in$^2$) | 3.74 | 76.1 | 0.285 |

While the disclosure has been described in connection with certain embodiments, it is to be understood that the disclosure is not to be limited to the disclosed embodiments but, on the contrary, is intended to cover various modifications and equivalent arrangements included within the spirit and scope of the disclosure, which scope is to be accorded the broadest interpretation so as to encompass all such modifications and equivalent structures as is permitted under the law.

What is claimed is:

1. A solar array comprising:
    a solar cell arranged directly on a mounting surface that extends along a first direction, the solar cell comprising a collection side that extends out from the mounting surface in a second direction that is substantially perpendicular to the first direction; and
    an angled reflector arranged directly on the mounting surface and adjacent to the solar cell in the first direction, the angled reflector comprising a lens in a wedge shape having:
        an entrance side configured to receive a light traveling along the second direction, the entrance side extending along the first direction and comprising a curved surface,
        a bottom side extending along the second direction and substantially parallel to the collection side of the solar cell, and
        a reflector side configured to reflect the light through the bottom side and into the collection side of the solar cell, the reflector side extending along the second direction at a first angle from the bottom side and comprising a plurality of flat surfaces substantially parallel to the bottom side and connected by a plurality of elevation surfaces at a second angle from the plurality of flat surfaces.

2. The solar array of claim 1, wherein the light is sun light.

3. The solar array of claim 1, wherein the second angle is less than or equal to about 90 degrees.

4. A method of increasing electricity output in a solar array in a given area, the method comprising:
   receiving, by an angled reflector arranged directly on a mounting surface that extends along a first direction, a light from a second direction that is substantially perpendicular to the first direction; and
   reflecting, by the angled reflector, the light into a solar cell arranged directly on the mounting surface and adjacent to the angled reflector in the first direction, wherein the angled reflector comprises a lens in a wedge shape having:
      an entrance side configured to receive the light, the entrance side extending along the first direction and comprising a curved surface,
      a bottom side extending along the second direction and substantially parallel to a collection side of the solar cell that extends out from the mounting surface in the second direction, and
      a reflector side configured to reflect the light through the bottom side and into the collection side of the solar cell, the reflector side extending along the second direction at a first angle from the bottom side and comprising a a plurality of flat surfaces substantially parallel to bottom side and connected by a plurality of elevation surfaces at a second angle from the plurality of flat surfaces.

5. The method of claim 4, wherein the light is sun light.

6. The method of claim 4, wherein the second angle is less than or equal to about 90 degrees.

7. The solar array of claim 1, wherein the first angle is less than or equal to about 45 degrees.

8. The method of claim 4, wherein the first angle is less than or equal to about 45 degrees.

* * * * *